(12) United States Patent
Wang et al.

(10) Patent No.: US 10,553,801 B2
(45) Date of Patent: Feb. 4, 2020

(54) ORGANIC LIGHT EMITTING DIODE DISPLAY DEVICE HAVING SUBSTRATE WITH CONCAVE LIGHT TRAPPING MICROSTRUCTURES

(71) Applicants: BOE TECHNOLOGY GROUP CO., LTD., Beijing (CN); Hefei Xinsheng Optoelectronics Technology Co., Ltd., Anhui (CN)

(72) Inventors: Jun Wang, Beijing (CN); Guangyao Li, Beijing (CN); Dongfang Wang, Beijing (CN); Jun Liu, Beijing (CN); Guangcai Yuan, Beijing (CN); Leilei Cheng, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/991,134

(22) Filed: May 29, 2018

(65) Prior Publication Data
US 2019/0173028 A1    Jun. 6, 2019

(30) Foreign Application Priority Data
Dec. 6, 2017    (CN) .......................... 2017 1 1274870

(51) Int. Cl.
*H01L 51/00*    (2006.01)
*H01L 51/56*    (2006.01)
*H01L 51/52*    (2006.01)

(52) U.S. Cl.
CPC ...... *H01L 51/0096* (2013.01); *H01L 51/5206* (2013.01); *H01L 51/5221* (2013.01); *H01L 51/5268* (2013.01); *H01L 51/5271* (2013.01); *H01L 51/5275* (2013.01); *H01L 51/56* (2013.01); *H01L 2251/5323* (2013.01)

(58) Field of Classification Search
CPC ............ H01L 21/0203; H01L 21/0243; H01L 51/5265; H01L 51/5268
See application file for complete search history.

(56) References Cited

U.S. PATENT DOCUMENTS

2005/0029538 A1* 2/2005 Choi ...................... H01L 51/52
                                                        257/103
2017/0254930 A1    9/2017 Hart et al.

FOREIGN PATENT DOCUMENTS

| CN | 1849847 A | 10/2006 |
|----|-----------|---------|
| CN | 101894924 A | 11/2010 |
| TW | 201201622 A | 1/2012 |

OTHER PUBLICATIONS

First Office Action for Chinese Patent Application No. 201711274870.8 dated Feb. 27, 2019.

\* cited by examiner

*Primary Examiner* — Daniel Whalen
(74) *Attorney, Agent, or Firm* — Calfee, Halter & Griswold LLP

(57) ABSTRACT

The present disclosure relates to a substrate, a method for fabricating the same and an organic light emitting diode display device. The substrate includes a metal foil. A metal material used for the metal foil is capable of being anodized and a plurality of concave light trapping microstructures is formed on a surface of the metal foil.

8 Claims, 4 Drawing Sheets

ORGANIC LIGHT EMITTING DIODE DISPLAY DEVICE HAVING SUBSTRATE WITH CONCAVE LIGHT TRAPPING MICROSTRUCTURES

CROSS REFERENCE

The present application claims the priority of Chinese Patent Application No. 201711274870.8, filed on Dec. 6, 2017, and the entire contents thereof are incorporated herein by reference as part of the present application.

TECHNICAL FIELD

The present disclosure relates to the field of semiconductor technology, in particular, to a substrate, a method for fabricating the same and an organic light emitting diode display device.

BACKGROUND

An OLED (Active Matrix/Organic Light Emitting Diode) display device is an active light emitting display device. As shown in FIG. 1, the OLED display device generally includes a substrate 1, an anode 2 disposed on the substrate 1, an organic light emitting layer 3 and a cathode 4. For the bottom-emitting OLED device, as shown in FIG. 1, the light generated by the organic light-emitting layer 3 passes through the organic light-emitting layer 3, the anode 2 and the substrate 1, and finally emits from the substrate 1 to the air.

It should be noted that the information disclosed in the foregoing background section is only for enhancement of understanding of the background of the disclosure and therefore may include information that does not constitute prior art that is already known to those skilled in the art.

SUMMARY

According to an aspect of embodiments of the present disclosure, there is provided a substrate including a metal foil. A metal material used for the metal foil is capable of being anodized and a plurality of concave light trapping microstructures are formed on a surface of the metal foil.

According to an embodiment, the plurality of the concave light trapping microstructures is arranged in a cellular shape.

According to an embodiment, the metal material is an aluminum foil or a titanium foil.

According to another aspect of embodiments of the present disclosure, there is provided an organic light emitting diode display device which includes any one of the above substrates.

According to another aspect of embodiments of the present disclosure, there is provided a method for fabricating a substrate. The method includes the following steps.

A metal foil is provided.

The metal foil is oxidized to form a plurality of metal oxide layers with periodically varying thicknesses on a surface of the metal foil.

The metal oxide layers are peeled off by an acidic solution and at the same time, a plurality of concave light trapping microstructures are formed on the surface of the metal foil.

According to an embodiment, after providing a metal foil, the method further includes the following step.

The metal foil is imprinted so as to form a plurality of pit microstructures on the surface of the metal foil.

According to an embodiment, the providing a metal foil includes:

flattening a surface of a metal sheet and removing a natural oxide film from the surface of the metal sheet; and chemically polishing the metal sheet to form a metal foil.

According to an embodiment, the imprinting the metal foil so as to form a plurality of pit microstructures on the surface of the metal foil includes:

using a grating plate with a periodic convex pattern as a template and forming, by hot pressing, the plurality of the pit microstructures periodically arranged on the surface of the metal foil.

According to an embodiment, the oxidizing the metal foil to form a plurality of metal oxide layers with periodically varying thicknesses on a surface of the metal foil includes:

conducting electrolysis with the metal foil as an anode, a carbon rod as a cathode and an acid solution as electrolyte, so as to form a metal oxide layer with a nanotube array structure on the surface of the metal foil.

According to an embodiment, the peeling off the metal oxide layers by an acidic solution includes:

conducting electrolysis with the metal foil as a cathode, a carbon rod as an anode and an acid solution as electrolyte, so as to separate the metal oxide layer from the metal foil.

It is to be understood that the foregoing general description and the following detailed description are exemplary and explanatory only and are not restrictive of the present disclosure.

BRIEF DESCRIPTION OF THE DRAWINGS

The accompanying drawings herein are incorporated in and constitute a part of this specification, illustrate embodiments consistent with the present disclosure, and together with the specification, serve to explain the principles of the present disclosure.

DETAILED DESCRIPTION

Exemplary embodiments will be described in detail herein, examples of which are illustrated in the accompanying drawings. When the following description refers to the accompanying drawings, the same numerals in different drawings indicate the same or similar elements, unless otherwise indicated. The implementations described in the following exemplary embodiments do not represent all embodiments consistent with the present disclosure. Instead, they are merely examples of devices and methods consistent with some aspects of the disclosure as described in the appended claims in detail.

Figure 1:
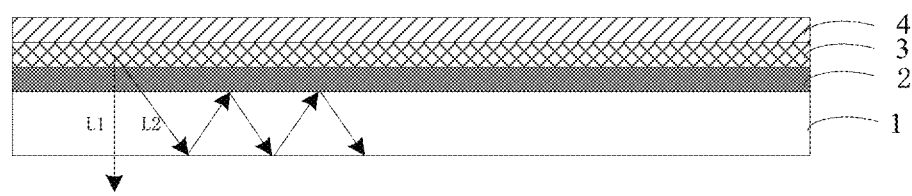
FIG. 1 is a schematic diagram illustrating a structure of an OLED device in the prior art.

As shown in FIG. 1, in the OLED display device, when the light generated by the organic light emitting layer 3 passes through each interface, including the interface between the organic light emitting layer 3 and the anode 2, the interface between the anode 2 and the substrate 1, and the interface between the substrate 1 and air, light will be reflected, refracted, and even totally reflected at the interface. For example, when the light is to enter into air from the substrate 1, part of the light, such as the light L2 in FIG. 1, may be caused a total reflection at the interface between the substrate 1 and the air due to that an incident angle of the light is greater than a critical angle, and this part of the light is confined within the substrate 1 and cannot be emitted, thus causing light loss, which is also referred to as modal loss of the substrate.

Since the modal loss of the substrate will reduce the light extraction efficiency of the OLED display device, how to improve the light extraction efficiency is a problem that needs to be solved.

Accordingly, embodiments of the present disclosure provide a substrate that can be applied to an OLED display device to improve its light extraction efficiency. The substrate includes a metal foil, and the metal material used for the metal foil can be anodized, and the plurality of concave light trapping microstructures is formed on a surface of the metal foil.

The substrate of the embodiment of the present disclosure uses a metal foil, and the metal foil may be a sheet formed by calendaring a high-purity metal multiple times. The metal material used for the metal foil has anodizing capability, and the anodizing capability refers to that, under the corresponding electrolyte and the specific process conditions, a layer of metal oxide film can be formed on the surface of the metal that is used as the anode owing to the externally applied current. The metal material is, for example, aluminum or titanium.

The metal foil is, for example, an aluminum foil or a titanium foil. The aluminum foil or the titanium foil has good mechanical strength, light weight, no thermal adhesiveness, strong reflection capability to light, and flexibility, therefore it is particularly suitable for substrates of flexible display devices.

A plurality of concave light trapping microstructures is formed on the surface of the metal foil. The concave light trapping microstructure is a plurality of nano-sized or micro-sized pit structures formed on the surface of the metal foil. The cross-sectional shape of the pits along the thickness direction of the metal foil may be a semicircular shape, a partially elliptic shape, or other irregular shape. Due to a plurality of concave light trapping microstructures, when light is incident on the concave light trapping microstructures, the light can be reflected, refracted, and scattered, and this can disperse the light at any angle, and in turn, reduces amount of the light that is totally reflected at the interface between the substrate and air and reduces modal loss of the substrate due to total reflection of the substrate, thereby improving the light extraction efficiency of the light emitting device with the substrate and light utilization rate.

In an alternative embodiment, the plurality of concave light trapping microstructures is arranged in a in a cellular shape.

Figure 2:
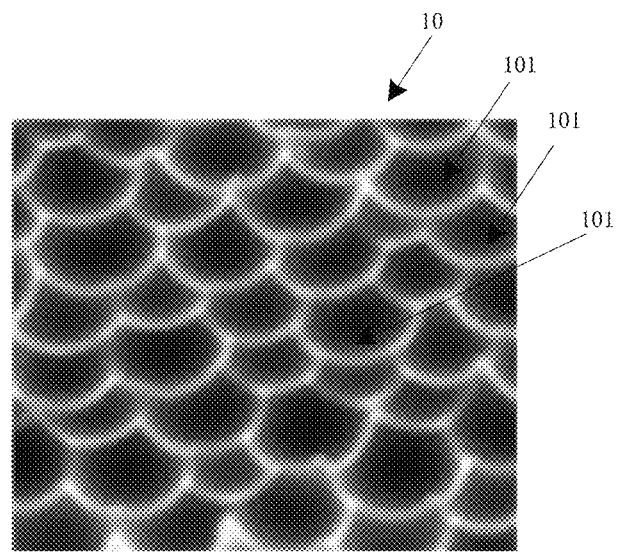
FIG. 2 is a schematic diagram illustrating a microstructure of a substrate according to an embodiment of the present disclosure.

In this embodiment, the plurality of concave light trapping microstructures 101 as the aluminum foil surface of the substrate 10 are arranged in a cellular shape as shown in FIG. 2, and the plurality of concave light trapping microstructures 101 are continuously distributed on the aluminum foil surface and arranged in a cellular shape as shown in FIG. 2.

Compared with a substrate having a conventional plane, such as a flat glass substrate and a $SnO_2$:F transparent glass substrate (abbreviated as FTO), the substrate has a stronger light trapping effect.

Figure 3:
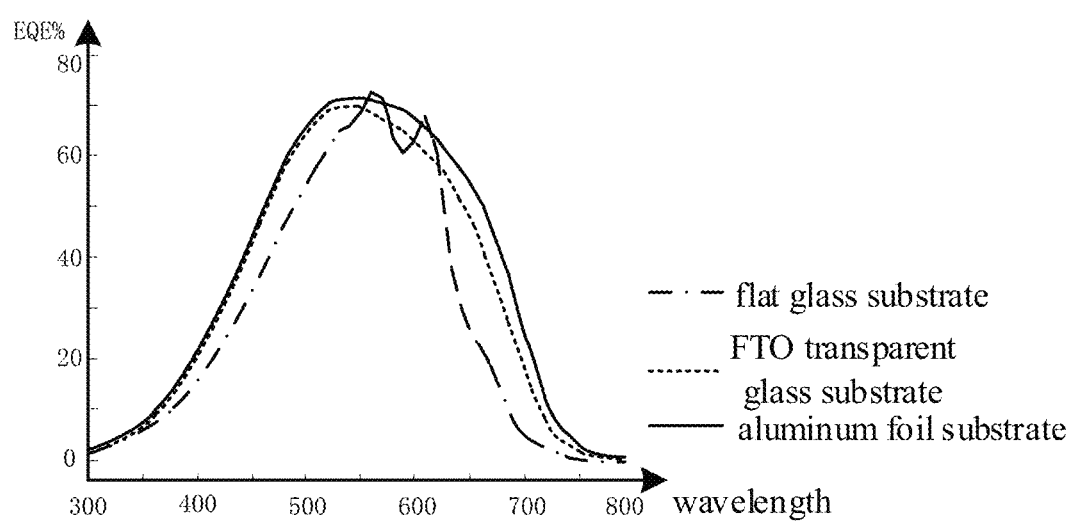
FIG. 3 is a graph illustrating a relationship between the light of the different wavelengths corresponding to different substrates and External Quantum Efficiency (EQE) according to an embodiment of the present disclosure.

FIG. 3 is a schematic diagram showing the relationships between the light of the 300-800 nm wavelengths respectively corresponding to a flat glass substrate, an FTO transparent glass substrate, and an aluminum foil substrate of the present embodiment and External Quantum Efficiency (EQE). As can be seen from the figure, for the light of 300-800 nm wavelengths, the external quantum efficiency (EQE) of the aluminum foil substrate of the present embodiment is generally larger than those of the flat glass substrate and the FTO transparent glass substrate. In particular, for visible light with a wavelength ranging from 600 nm to 800 nm, the substrate of the present disclosure has a higher external quantum efficiency (EQE). Therefore, it can be seen that the substrate of the present embodiment can effectively increase the light transporting efficiency of visible light at a wavelength of 600 to 800 nm and further improve the light extraction efficiency.

In some examples, the thickness of the metal foil may be 1 to 10 mm.

The embodiments of the present disclosure also provide an organic light emitting diode (OLED) display device, which includes the substrate described in any one of the above embodiments.

The OLED display device employs the metal foil as described by the above embodiment to be a substrate to enable the display device to have higher light extraction efficiency.

Figure 4:
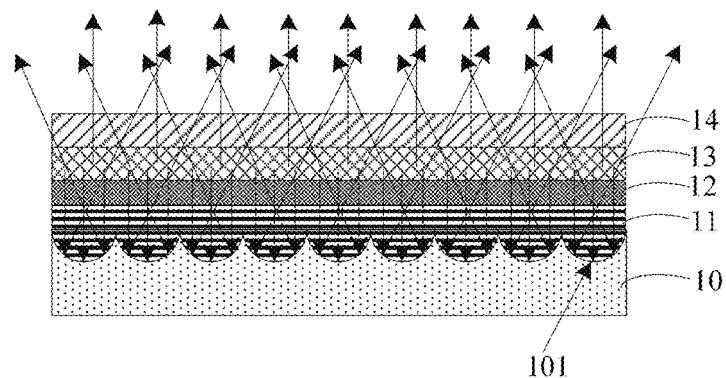
FIG. 4 is a schematic diagram illustrating a structure of a display device according to an embodiment of the present disclosure.

In some examples, as shown in FIG. 4, the above-described OLED display device may further include a flat layer 11, an anode 12, an organic light emitting layer 13, and a cathode 14 which are sequentially disposed on the substrate 10.

In this embodiment, since a plurality of concave light trapping microstructures 101 are formed on the surface of the metal foil that is used as the substrate 10, in order to make the anode, the organic light emitting layer, and the cathode formed on the metal foil later be relatively uniform, a flat layer 11 is firstly formed on the metal foil. The material used for the flat layer is filled in each concave light trapping microstructure on the surface of the metal foil, and this can enable a flat surface to be formed for the metal foil 10. Next, the anode 12, the organic light emitting layer 13 and cathode 14 are sequentially formed on the flat layer 11.

The material of the flat layer may be various materials such as organic resin, silicon nitride, silicon oxide, or the like. The anode may be made of, for example, indium tin oxide (ITO). The organic light emitting layer may include a hole transport layer (HTL), a light emitting layer, and an electron transport layer (ETL), and may further include an electron injection layer (EIL) and a hole injection layer (HIL). The cathode may include transparent conductive materials to form a top-emitting OLED display device.

The display device is an OLED display device which, as shown in FIG. 4, employs the substrate 10 of the above embodiment. Since the surface of the metal foil is formed with a plurality of concave light trapping microstructures 101, when the light generated by the organic light emitting layer 13 is incident on the substrate 10 and on the concave light trapping microstructure 101, the light is reflected, refracted, and scattered to disperse the light at various angles, thereby reducing the amount of the light that is totally reflected at the interface between the substrate 10 and air, increasing the amount of the light emitted from the substrate 10, reducing the modal loss of the substrate due to the total reflection of the substrate, improving the light extraction efficiency of the light generated by the organic light emitting layer 13, and improving the light utilization efficiency of the display device.

It should be noted that the above display device may also include other existing structures, such as a driving circuit, a cover glass, or the like, which are not limited in this embodiment.

The organic light emitting diode display device of embodiments of the present disclosure may be a display device for various types of products or components that can have display function, such as a mobile phone, a tablet computer, a television, a notebook computer, a digital photo frame, a navigator and the like.

Figure 5:
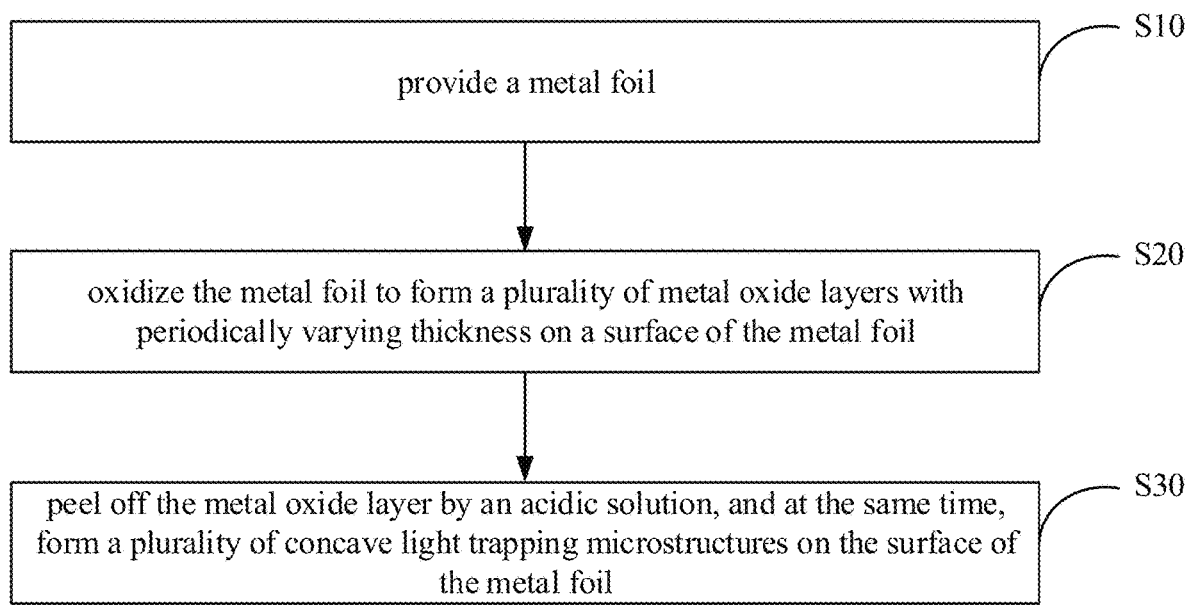
FIG. 5 is a flow chart illustrating a method for fabricating a substrate according to an embodiment of the present disclosure.

The embodiment of the present disclosure also provides a method for fabricating a substrate. As shown in FIG. 5, the method includes the following steps.

Step S10: a metal foil is provided.

Step S20: the metal foil is oxidized to form a plurality of metal oxide layers with periodically varying thickness on a surface of the metal foil.

Step S30: the metal oxide layer is peeled off by an acidic solution, and at the same time, a plurality of concave light trapping microstructures is formed on the surface of the metal foil.

In the embodiment, the metal foil is oxidized and metal ions and cations are combined to form a metal oxide layer in the course of oxidation. Since different positions of the metal foil are oxidized to different degrees, a metal oxide layer with a periodically varying thickness may be formed on the surface of the metal foil. After the metal oxide layer is peeled off by the acidic solution, the thickness of the metal foil varies periodically and thus a plurality of concave light trapping microstructures are formed on the surface of the metal foil.

In the course of oxidation described above, for different period of the oxidation, the formed recessed microstructures may have different depths in the thickness direction of the metal foil.

Figure 6:
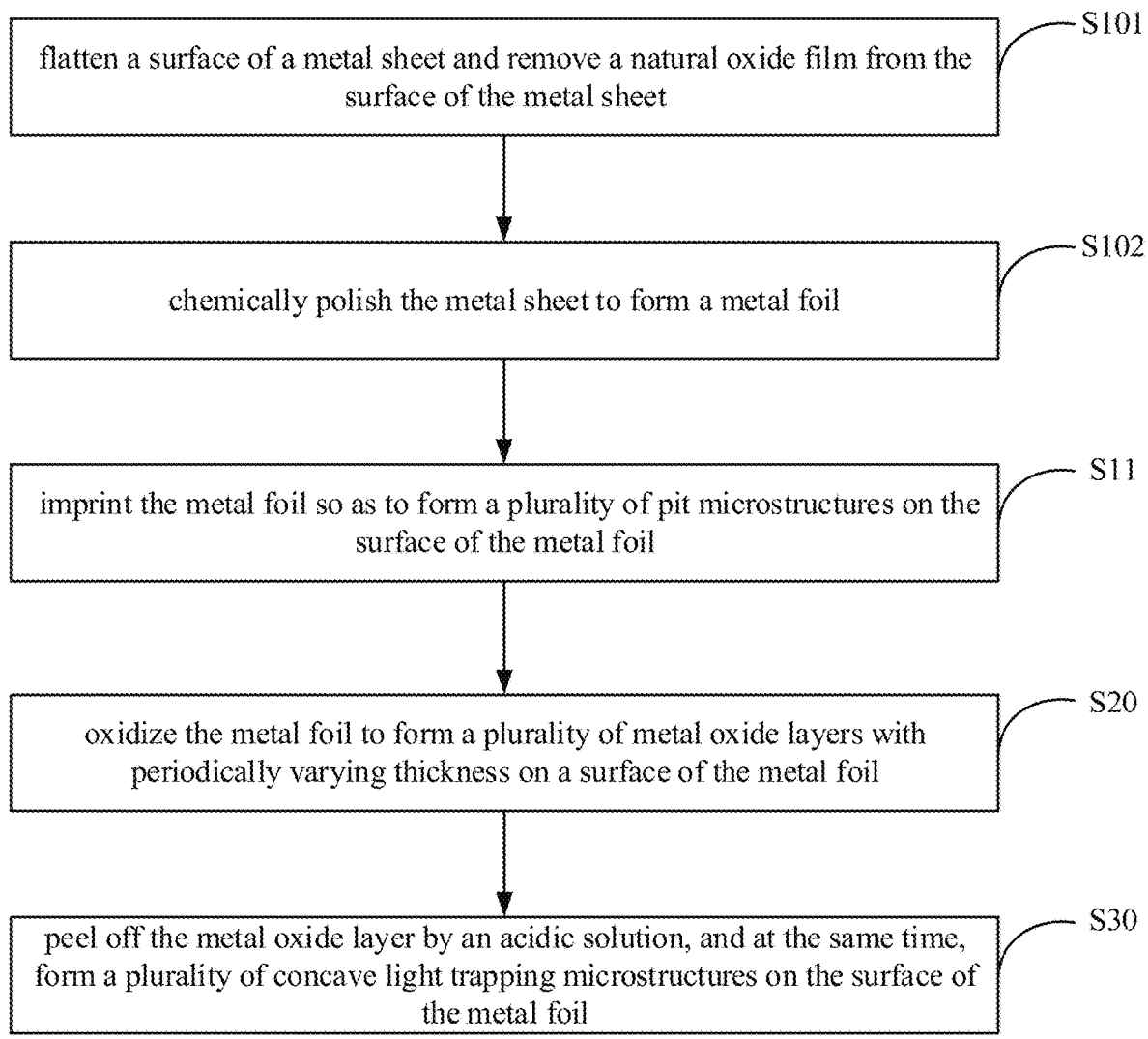
FIG. 6 is a flow chart illustrating a method for fabricating a substrate according to another embodiment of the present disclosure.

In an alternative implementation, as shown in FIG. 6, after providing a metal foil described in step S10 above, the method may further include the following step.

Step S11: the metal foil is imprinted so as to form a plurality of pit microstructures on the surface of the metal foil.

The pit microstructure refers to a nano-sized or micron-sized pit structure formed on the surface of the metal foil and the pit microstructure is a prototype for the concave light trapping microstructure formed on the surface of the metal foil. The pit microstructure and the final formed concave light trapping microstructure have the same profile, but the depth and the size of the concave light trapping microstructure are greater than those of the pit microstructures.

Specifically, forming a plurality of pit microstructures on the surface of the metal foil may include: a grating plate with a periodic convex pattern may be used as a template, and a plurality of pit microstructures periodically arranged on the surface of the metal foil may be formed by hot pressing. For example, a grating plate with a periodic convex pattern is overlaid on the metal foil, and then a certain pressure is applied to the grating plate by a hot press forming apparatus, and thus the periodic convex pattern on the grating plate is transferred onto the metal foil and the plurality of the pit microstructure periodically arranged on the metal foil is formed accordingly.

The above-mentioned periodical convex pattern on the grating plate is, for example, a two-dimensional cylindrical grating pattern, the distance between adjacent grating patterns may be several micrometers, and the diameter of the cylindrical cross-section may be several hundred nanometers. In this way, the grating pattern can be transferred onto the surface of the metal foil by hot pressing, and the surface of the metal foil is formed with a plurality of corresponding pit microstructures arranged periodically.

In this embodiment, since the surface of the metal foil has a plurality of pits, when the metal foil is oxidized, the degree of oxidation at the different positions of the metal foil is greatly different, so that the formed pit microstructures have a deeper depth in the direction of the thickness of the metal foil to form the concave light trapping microstructures, which enhances the effect of reflection, refraction, and scattering of the light incident on the concave light trapping microstructure, further reduces the modal loss of the substrate due to total reflection of the substrate, increases the light extraction efficiency of the light emitting device having the substrate, and improves light utilization efficiency.

In some examples, as shown in FIG. 6, the step of providing a metal foil as described in step S10 may include the following step.

Step S101: a surface of a metal sheet is flattened and a natural oxide film is removed from the surface of the metal sheet.

Step S102: the metal sheet is chemically polished to form a metal foil.

In this embodiment, the metal sheet is first pretreated and then polished.

Specifically, the metal sheet is first imprinted to make the surface flat, and then the metal sheet is put into an alkaline solution with a certain concentration and a certain temperature for a period of time. For example, the metal sheet is immerged in a NaOH solution at 70° C. for several minutes to remove the natural oxide film from the surface of the metal sheet; and then, using an acidic solution, such as, a mixed solution of phosphoric acid and chromic acid (the mass ratio of the components in the solution is, for example, Phosphoric acid:Chromium trioxide:Water=80:12:8), the metal sheet is electrochemically polished at a certain temperature (for example, 75° C.) by constant current with a certain size of a current density (for example, 120 mA·cm$^{-2}$) for several minutes, to form a shiny surface on the surface of the metal sheet; and finally, the metal foil is formed.

In an alternative embodiment, the oxidizing the metal foil to form a plurality of metal oxide layers with periodically varying thickness on a surface of the metal foil, as described in step S20, may include the following step.

Electrolysis is conducted with the metal foil as an anode, a carbon rod as a cathode and an acid solution as electrolyte, so as to form a metal oxide layer with a nanotube array structure on the surface of the metal foil.

In this embodiment, a metal oxide layer is formed on the surface of the metal foil by electrolysis. During the anodization of the metal foil, due to the etching on the metal by H+ icons in the acidic solution, the metal loses electrons to become a positively charged metal ion, oxygen element gets electrons and becomes negatively charged oxygen ion ($O^{2-}$), positively charged metal ions and negatively charged oxygen ions are combined to form a metal oxide layer.

On the surface of the metal foil, especially after forming a plurality of pit microstructures periodically arranged by hot pressing, the distribution of the electric field in the corresponding region is not uniform during anodization, which results in a variable rate for etching the metal foil, thereby forming the metal oxide layer with a nanotube array structure, each metal oxide layer with the nanotube array structure includes a plurality of metal oxide layers with a nanotube array structure arranged in a matrix, each metal oxide layer with the nanotube array structure covers the metal oxide layer with a nano-sized approximately equilateral hexagonal structure on the surface of the metal foil, and a hole exist at the center thereof.

During the formation of the metal oxide layer, since the energy of the approximately equilateral hexagonal structure is the lowest and most stable, after peeling off the metal oxide layer, a plurality of concave light trapping microstructures arranged in a cellular shape are formed on the surface of the metal foil. If the plurality of pit microstructures periodically arranged is formed by hot pressing of the metal foil, the formed concave light trapping microstructures will be more regular.

Figure 7:
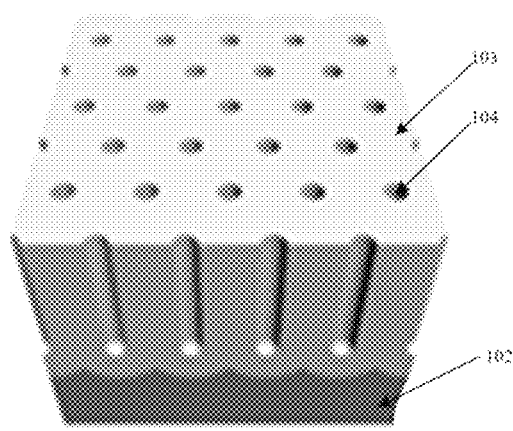
FIG. 7 is a schematic diagram illustrating a microstructure in which an aluminum oxide layer is formed on a surface of an aluminum foil according to an embodiment of the present disclosure.

Referring to FIG. 7, taking the aluminum foil as an example, during the above electrolysis, an oxidation reaction takes place on the aluminum foil 102 which is used as anode, and an aluminum oxide layer 103 with a nanotube structure arranged in a matrix is formed on the surface of the aluminum foil 102. The thickness of the aluminum layer 103 on the surface of the aluminum foil 102 varies periodically, and the aluminum oxide layer 103 has holes 104 arranged in an array. The holes are, for example, circular, that is, portions of the holes 104 expose the bottom surface of the aluminum foil 102.

In some examples, peeling off the metal oxide layer by an acidic solution as described in step S30, includes the following step.

Electrolysis is conducted with the metal foil as a cathode, a carbon rod as an anode and an acid solution as electrolyte, so as to separate the metal oxide layer from the metal foil.

In this embodiment, electrolysis is performed in an acidic solution by a reverse electrode stripping method to separate the metal oxide layer from the metal foil and peel off the metal oxide layer, thereby forming a plurality of concave light trapping microstructures on the surface of the metal foil. The separated metal oxide layer is peeled off from the metal foil by the gas release action which is generated after the circuit is reversed.

Specifically, for example, after the metal foil is oxidized, the cathode and the anode are directly reversed, and electrolysis is performed using a current with the first size of the current density; next, the voltage between the anode and the cathode is gradually raised until the gas evenly flows from the metal foil; and then the voltage is kept being constant. After conducting electrolysis for several minutes, the metal oxide layer can be separated from the metal foil.

The above acidic solution may be a mixed solution including an acid and an alcohol or a mixed solution including chromic acid and phosphoric acid.

The above mixed solution including an acid and an alcohol may be a mixed solution including oxalic acid and ethanol. The volume ratio of oxalic acid and ethanol in the mixed solution is, for example, 1:1 to 1:5. In the electrolytic process, the temperature of the electrolytic solution is, for example, less than zero degrees, the voltage is, for example, 350V to 450V, and the electrolysis period is, for example, for 4-8 minutes.

Of course, the acidic solution may also be other mixed solution including an acid and an alcohol or other mixed solution including an acid and an acid. The volume ratio of each component, the temperature and voltage of the electrolyte, and the like may also be configured as required, and the present disclosure is not limited thereto.

It should be noted that in the drawings, the dimensions of layers and regions may be exaggerated for clarity of illustration. It will also be understood that when an element or layer is referred to as being "on" another element or layer, the element or layer can be directly on the other element or layer, or intervening layers may be present there-between. In addition, it will be understood that when an element or layer is referred to as being "under" another element or layer, the element or layer can be directly under the another element or layer, and there may be more than one intervening layers or elements. In addition, it will also be understood that when a layer or element is referred to as being "between" two layers or two elements, it can be the only layer between two layers or two elements, or more than one intervening layers or elements can also exist. Like reference numerals refer to like elements throughout.

Those skilled in the art will readily recognize other embodiments of the present disclosure upon consideration of the specification and practice of the present disclosure disclosed herein. This disclosure is intended to cover any variations, uses, or adaptations of the present disclosure and these follow the general principles of the present disclosure and include common knowledge or customary means in the art that are not disclosed in this disclosure. The specification and examples are exemplary only, with the true scope and spirit of the present disclosure being indicated by the following claims.

It should be understood that the present disclosure is not limited to the precise structure that has been described above and shown in the drawings, and various modifications and changes may be made without departing from the scope thereof. The scope of the present disclosure is limited only by the attached claims.

What is claimed is:

1. A method for fabricating a substrate, comprising:
providing a metal foil;
imprinting the metal foil so as to form a plurality of pit microstructures on the surface of the metal foil;
oxidizing the metal foil to form a plurality of metal oxide layers with periodically varying thickness on a surface of the metal foil; and
peeling off the metal oxide layers by an acidic solution and forming a plurality of concave light trapping microstructures on the surface of the metal foil at the same time.

2. The method for fabricating the substrate according to claim 1, wherein the step of providing the metal foil comprises:
flattening a surface of a metal sheet and removing a natural oxide film from the surface of the metal sheet; and
chemically polishing the metal sheet to form the metal foil.

3. The method for fabricating the substrate according to claim 2, wherein the step of peeling off the metal oxide layers by the acidic solution comprises:

conducting electrolysis with the metal foil as a cathode, a carbon rod as an anode and the acid solution as electrolyte, so as to separate the metal oxide layer from the metal foil.

4. The method for fabricating the substrate according to claim 1, wherein the step of imprinting the metal foil so as to form the plurality of pit microstructures on the surface of the metal foil comprises:

using a grating plate with a periodic convex pattern as a template and forming, by hot pressing, the plurality of the pit microstructures periodically arranged on the surface of the metal foil.

5. The method for fabricating the substrate according to claim 4, wherein the step of peeling off the metal oxide layers by the acidic solution comprises:

conducting electrolysis with the metal foil as a cathode, a carbon rod as an anode and the acid solution as electrolyte, so as to separate the metal oxide layer from the metal foil.

6. The method for fabricating the substrate according to claim 1, wherein the step of oxidizing the metal foil to form the plurality of metal oxide layers with periodically varying thicknesses on the surface of the metal foil comprises:

conducting electrolysis with the metal foil as an anode, a carbon rod as a cathode and an acid solution as electrolyte, so as to form a metal oxide layer with a nanotube array structure on the surface of the metal foil.

7. The method for fabricating the substrate according to claim 6, wherein the step of peeling off the metal oxide layers by the acidic solution comprises:

conducting electrolysis with the metal foil as a cathode, the carbon rod as an anode and the acidic solution as electrolyte, so as to separate the metal oxide layer from the metal foil.

8. The method for fabricating the substrate according to claim 1, wherein the step of peeling off the metal oxide layers by the acidic solution comprises:

conducting electrolysis with the metal foil as a cathode, a carbon rod as an anode and the acid solution as electrolyte, so as to separate the metal oxide layer from the metal foil.

* * * * *